US009099438B2

(12) United States Patent
Park et al.

(10) Patent No.: US 9,099,438 B2
(45) Date of Patent: Aug. 4, 2015

(54) THIN FILM TRANSISTOR ARRAY PANEL

(71) Applicant: Samsung Display Co., Ltd., Yongin, Gyeonggi-do (KR)

(72) Inventors: Jae Woo Park, Seongnam-si (KR); Do-Hyun Kim, Seongnam-si (KR); Young Joo Choi, Anyang-si (KR); Dong Hoon Lee, Seoul (KR); Sung Haeng Cho, Shungcheongbuk-do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 149 days.

(21) Appl. No.: 13/660,362

(22) Filed: Oct. 25, 2012

(65) Prior Publication Data

US 2013/0299817 A1 Nov. 14, 2013

(30) Foreign Application Priority Data

May 11, 2012 (KR) ........................ 10-2012-0050177

(51) Int. Cl.

*H01L 29/10* (2006.01)
*H01L 29/45* (2006.01)
*H01L 29/49* (2006.01)
*H01L 29/786* (2006.01)
*H01L 27/12* (2006.01)

(52) U.S. Cl.

CPC ............ *H01L 29/45* (2013.01); *H01L 27/1225* (2013.01); *H01L 29/4908* (2013.01); *H01L 29/7869* (2013.01); *H01L 29/78618* (2013.01)

(58) Field of Classification Search

CPC ..................... H01L 29/4908; H01L 29/78618; H01L 29/7869

USPC ............................................................ 257/43

See application file for complete search history.

(56) References Cited

U.S. PATENT DOCUMENTS 7,619,254 B2 11/2009 Lee et al.
2008/0296567 A1* 12/2008 Irving et al. .................... 257/43
2010/0117075 A1 5/2010 Akimoto et al.
2010/0123131 A1 5/2010 Tokunaga (Continued)

FOREIGN PATENT DOCUMENTS

JP 2011-100994 5/2011
JP 2011-142316 7/2011

(Continued)

OTHER PUBLICATIONS

**US 2013-0115733 corresponds to KR10-2013-0050829, May 9, 2013.

(Continued)

*Primary Examiner* — Douglas Menz
(74) *Attorney, Agent, or Firm* — F. Chau & Associates, LLC

(57) ABSTRACT

A thin film transistor array panel includes: a gate line disposed on a substrate and including a gate electrode, a semiconductor layer including an oxide semiconductor disposed on the substrate, and a data wire layer disposed on the substrate and including a data line intersecting the gate line, a source electrode connected to the data line, and a drain electrode facing the source electrode. In addition, at least one of the data line, the source electrode or the drain electrode of the data wire layer includes a barrier layer and a main wiring layer disposed on the barrier layer. The main wiring layer includes copper or a copper alloy. Also, the barrier layer includes a metal oxide, and the metal oxide includes zinc.

18 Claims, 9 Drawing Sheets

191
171
II
185
175
II
154
173 124 121

(56) References Cited

U.S. PATENT DOCUMENTS

| | | | |
|---|---|---|---|
| 2010/0159639 | A1 | 6/2010 | Sakata |
| 2010/0224873 | A1 | 9/2010 | Sakata et al. |
| 2012/0319112 | A1 | 12/2012 | Cho et al. |
| 2013/0099240 | A1 | 4/2013 | Lee et al. |
| 2013/0115733 | A1 | 5/2013 | Kim et al. |

FOREIGN PATENT DOCUMENTS

| | | | |
|---|---|---|---|
| JP | 2011-187506 | | 9/2011 |
| KR | 1020060023697 | A | 3/2006 |
| KR | 1020080016234 | A | 2/2008 |
| KR | 1020080016238 | A | 2/2008 |
| KR | 100857482 | | 9/2008 |
| KR | 1020100051544 | A | 5/2010 |
| KR | 1020130039403 | | 4/2013 |
| KR | 1020130050829 | | 5/2013 |

OTHER PUBLICATIONS

**US 2013-0099240 corresponds to KR10-2013-0039403, Apr. 25, 2013.

* cited by examiner

THIN FILM TRANSISTOR ARRAY PANEL

CROSS-REFERENCE TO RELATED APPLICATION

This application claims priority to Korean Patent Application No. 10-2012-0050177 filed on May 11, 2012, the entire disclosure of which is hereby incorporated by reference herein in its entirety.

TECHNICAL FIELD

The present invention relates to a thin film transistor array panel.

DISCUSSION OF THE RELATED ART

A flat panel display such as, for example, a liquid crystal display, an organic light emitting diode display, or the like may include a plurality of pairs of field generating electrodes and an electro-optical active layer interposed therebetween. The liquid crystal display includes a liquid crystal layer as the electro-optical active layer and the organic light emitting diode display includes an organic emission layer as the electro-optical active layer.

One of a pair of field generating electrodes may be connected to a switching element to receive an electric signal, and the electro-optical active layer may convert the electric signal into an optical signal, thereby displaying an image.

In the flat panel display, a thin film transistor (TFT), which is a three-terminal element, is used as the switching element, and signal lines of a gate line transferring a scanning signal for controlling the thin film transistor, a data line transferring a signal applied to a pixel electrode, and the like are included in the flat panel display.

As the area of the display device has become larger, a method of reducing resistance in signal lines has been researched to implement high-speed driving oxide semiconductor technology. For example, to reduce the resistance of the signal line, a main wiring layer formed of copper or a copper alloy, and a barrier layer made of an oxide semiconductor have been researched in an attempt to prevent the material such as copper from being diffused into the semiconductor layer.

SUMMARY

Exemplary embodiments of the present invention provide a thin film transistor array panel including a barrier layer interposed between a main wiring layer and a semiconductor layer.

Exemplary embodiments of the present invention provide a thin film transistor array panel including a capping layer interposed between a main wiring layer and a passivation layer.

In accordance with an exemplary embodiment of the present invention, a thin film transistor array panel is provided. The thin film transistor array panel includes: a gate line disposed on a substrate and including a gate electrode, a semiconductor layer including an oxide semiconductor disposed on the substrate and a data wire layer disposed on the substrate and including a data line intersecting the gate line, a source electrode connected to the data line, and a drain electrode facing the source electrode. In addition, at least one of the data line, the source electrode or the drain electrode of the data wire layer includes a barrier layer, a main wiring layer disposed on the barrier layer, and a capping layer disposed on the main wiring layer. The main wiring layer includes copper or a copper alloy. Also, the barrier layer and the capping layer includes a metal oxide, and the metal oxide includes zinc.

The barrier layer may include one of indium-zinc oxide (IZO), gallium-zinc oxide (GZO), or aluminum-zinc oxide (AZO).

The barrier layer may include gallium-zinc oxide (GZO), and an amount of gallium oxide ($Ga_2O_3$) included in gallium-zinc oxide (GZO) may be in a range from about 2.5 mol % to about 10 mol %.

The barrier layer may include indium-zinc oxide (IZO), and the amount of indium oxide ($In_2O_3$) included in indium-zinc oxide (IZO) may be in the range from about 2.5 wt % (about 0.75 mol % or about 1.5 at %) to about 90 wt %.

The barrier layer may include indium-zinc oxide (IZO) and the amount of indium oxide ($In_2O_3$) included in indium-zinc oxide (IZO) may be no greater than 65 wt % (about 35.3 mol % or about 52.1 at %), and the barrier layer may be in a polycrystalline state.

The barrier layer may include indium-zinc oxide (IZO), and the amount of indium oxide ($In_2O_3$) included in indium-zinc oxide (IZO) may be in a range from about 15 wt % (about 4.9 mol % or about 9.4 at %) to about 65 wt % (about 35.3 mol % or about 52.1 at %).

The barrier layer may include indium-zinc oxide (IZO), and the amount of indium oxide ($In_2O_3$) included in indium-zinc oxide (IZO) may be in a range from about 20 wt % (about 6.8 mol % or about 12.8 at %) to about 40 wt % (about 16.4 mol % or about 28.1 at %).

The barrier layer may include indium-zinc oxide (IZO), in which a thickness of the barrier layer including indium-zinc oxide is no greater than 100 nm, and the barrier layer may have an average crystalline grain size of about 10 Å to about 2000 Å.

The barrier layer may include aluminum-zinc oxide (AZO) and the amount of aluminum oxide ($Al_2O_3$) included in aluminum-zinc oxide (AZO) may be in a range from about 2.5 mol % to about 50 mol %.

The capping layer may include one among indium-zinc oxide (IZO), gallium-zinc oxide (GZO), or aluminum-zinc oxide (AZO).

The capping layer may include gallium-zinc oxide (GZO) and the amount of gallium oxide ($Ga_2O_3$) included in gallium-zinc oxide (GZO) may be in a range from about 2.5 mol % (about 5.6 wt % or about 4.9 at %) to about 10 mol % (about 20.4 wt % or about 18.2 at %).

The capping layer may include indium-zinc oxide (IZO) and the amount of indium oxide ($In_2O_3$) included in indium-zinc oxide (IZO) may be in a range from about 20 wt % (about 6.8 mol % or about 12.8 at %) to about 40 wt % (about 16.4 mol % or about 28.1 at %).

The capping layer may include aluminum-zinc oxide (AZO) and the amount of aluminum oxide ($Al_2O_3$) included in aluminum-zinc oxide (AZO) may be in a range from about 2.5 mol % to about 50 mol %.

The barrier layer may have conductivity.

The semiconductor layer may have the same planar shape as the source electrode, the drain electrode, and the data line except for a channel portion of the semiconductor layer.

The barrier layer and the main wiring layer may directly contact each other.

The barrier layer is disposed between the main wiring layer and the semiconductor layer.

An etch rate of the barrier layer may be in a range from about 25 Å/s to about 110 Å/s.

In accordance with an exemplary embodiment of the present invention, a thin film transistor array panel is provided. The thin film transistor array panel includes a gate line disposed on a substrate and including a gate electrode, a gate insulating layer disposed on the gate line, a semiconductor layer including an oxide semiconductor disposed on the gate insulating layer, wherein the semiconductor layer extends in a longitudinal direction and includes a projection which extends toward the gate electrode and a data line intersecting the gate line, a source electrode connected to the data line, a drain electrode facing the source electrode, a passivation layer disposed on the data line, the drain electrode and on a portion of the projection of the semiconductor layer disposed between the source electrode and the drain electrode, wherein the data line, the source electrode and the drain electrode each include a barrier layer and a main wiring layer disposed on the barrier layer.

The main wiring layer includes a metal or a metal alloy, and the barrier layer and the capping layer includes a metal oxide, wherein the capping layer is in a polycrystalline state.

The barrier layer may include one of indium-zinc oxide (IZO), gallium-zinc oxide (GZO), or aluminum-zinc oxide (AZO).

The capping layer may include indium-zinc oxide (IZO), and wherein the amount of indium oxide ($In_2O_3$) included in indium-zinc oxide (IZO) is in a range from about 15 wt % to about 65 wt %.

The capping layer may include indium-zinc oxide (IZO), and wherein the amount of indium oxide ($In_2O_3$) included in indium-zinc oxide (IZO) is in a range from about 20 wt % to about 40 wt %.

The passivation layer may include a lower passivation layer which includes silicon oxide and an upper passivation layer which includes silicon nitride disposed on the lower passivation layer, wherein the lower passivation layer directly contacts the barrier layer and the main wiring layer of each of the data line, the source electrode and the drain electrode and wherein the main wiring layer of each of the data line, the source electrode and the drain electrode includes one of copper or a copper alloy.

The data line, the source electrode and the drain electrode each may further include a capping layer disposed between the passivation layer and the main wiring layer and wherein the capping layer of each of the data line, the source electrode and the drain electrode includes one of indium-zinc oxide (IZO), gallium-zinc oxide (GZO), or aluminum-zinc oxide (AZO).

The barrier layer of each of the data line, source electrode and the drain electrode may be disposed directly on the semiconductor layer.

The semiconductor layer may include at least one selected from the group consisting of zinc (Zn), indium (In), tin (Sn), gallium (Ga), and hafnium (Hf).

The semiconductor layer may include indium-gallium-zinc oxide.

The barrier layer of each of the data line, the source electrode and the drain electrode may be in a polycrystalline state According to an exemplary embodiment of the present invention, by forming the barrier layer made of the metal oxide, the characteristic deterioration of the thin film transistor by oxidation of the main wiring layer may be prevented, and by controlling the amount of oxide included in the barrier layer, the under-cut of barrier layer may be reduced.

BRIEF DESCRIPTION OF THE DRAWINGS

Exemplary embodiments of the present invention can be understood in more detail from the following detailed description taken in conjunction with the accompanying drawings, in which.

DETAILED DESCRIPTION OF EXEMPLARY EMBODIMENTS

Figure 1:
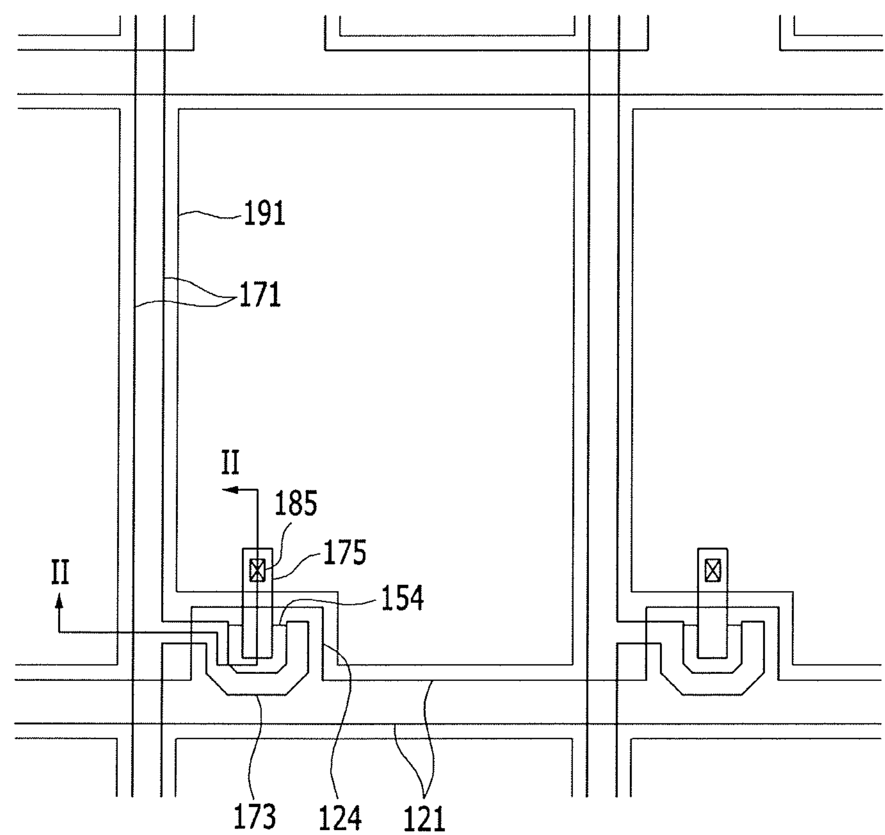
FIG. 1 is a top plan view of a thin film transistor array panel according to an exemplary embodiment of the present invention.

Exemplary embodiments of the present invention will be described more fully hereinafter with reference to the accompanying drawings, in which exemplary embodiments of the invention are shown. However, exemplary embodiments of the present invention are not limited to exemplary embodiments described herein, and may be embodied in other forms.

In the drawings, the thicknesses of layers and regions are exaggerated for clarity. It is to be noted that when a layer is referred to as being "on" another layer or substrate, it can be directly formed on the other layer or substrate or can be formed on the other layer or substrate with an intervening layer or layers interposed therebetween. Like constituent elements are denoted by like reference numerals throughout the specification.

As used herein, the singular forms "a," "an" and "the" are intended to include the plural forms as well, unless the context clearly indicates otherwise.

Figure 2:
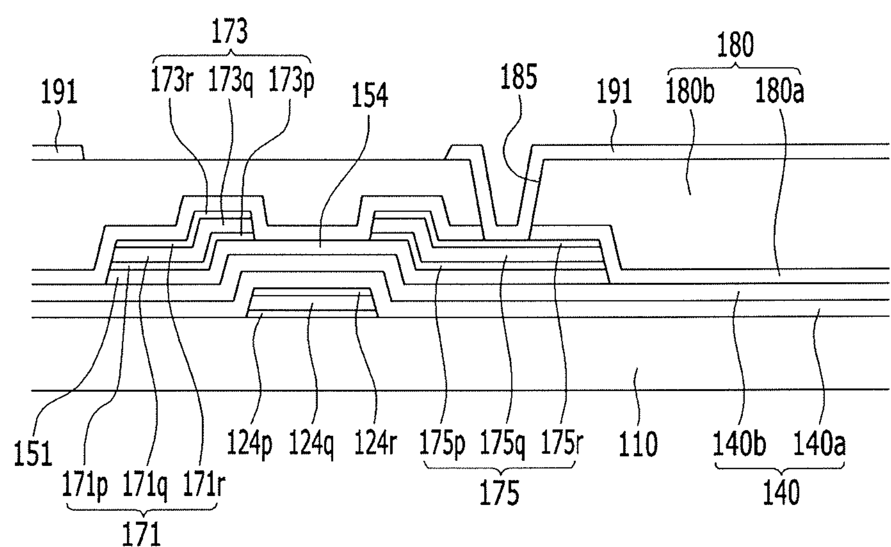
FIG. 2 is a cross-sectional view taken along the line II-II of FIG. 1.

FIG. 1 is a top plan view of a thin film transistor array panel according to an exemplary embodiment of the present invention. FIG. 2 is a cross-sectional view taken along the line II-II of FIG. 1.

Referring to FIG. 1 and FIG. 2, a thin film transistor array panel according to the present exemplary embodiment includes a plurality of gate lines 121 formed on an insulation substrate 110 made of, for example, transparent glass, quartz, or plastic. Also, in an exemplary embodiment, the insulation substrate 110, may be formed of, for example, ceramic or silicon materials. Further, in an exemplary embodiment, the insulation substrate 110 may be, for example, a flexible substrate. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof.

Each gate line 121 transmits a gate signal and extends mainly in a transverse direction. Each gate line 121 includes a plurality of gate electrodes 124 protruded from the gate line 121. For example, the gate line 121 and gate electrodes 124 may be formed of one of aluminum (Al), copper (Cu), molybdenum (Mo), titanium (Ti), nickel (Ni), tungsten (W), gold (Au), palladium (Pd), platinum (Pt), chromium (Cr), neodymium (Nd), zinc (Zn), cobalt (Co), manganese (Mn) and any mixtures or alloys thereof. In addition, the gate line 121 and gate electrodes 124, may include, for example, a transparent conductive material such as an indium tin oxide (ITO), an indium zinc oxide (IZO) and an aluminum doped zinc oxide (AZO).

For example, in an exemplary embodiment, the gate line 121 and the gate electrode 124 are made of, for example, a triple-layer structure. For example, in an exemplary embodiment the gate line 121 may include a first layer 121*p*, a second layer 121*q* and a third layer 121*r*. In addition, the gate electrode 124 may include, for example, a first layer 124*p*, a second layer 124*q* and a third layer 124*r*. For example, in an exemplary embodiment, the first layers 121*p* and 124*p*, the second layers 121*q* and 124*q*, and the third layers 121*r* and 124*r* may each be made of at least one of an aluminum-based metal such as aluminum (Al), an aluminum alloy, and the like, a silver-based metal such as silver (Ag), a silver alloy, and the like, a copper-based metal such as copper (Cu), a copper alloy, and the like, a molybdenum-based metal such as molybdenum (Mo), a molybdenum alloy, and the like, and chromium (Cr), titanium (Ti), tantalum (Ta), manganese (Mn), and the like.

Also, the first layers 121*p* and 124*p*, the second layers 121*q* and 124*q*, and the third layers 121*r* and 124*r* may be formed by combining layers having different physical properties. In the present exemplary embodiment, the gate line 121 and gate electrode 124 are formed in the triple-layer structure, but exemplary embodiments of the present invention are not limited thereto. Alternatively, for example, the gate line 121 and gate electrode 124 may be formed in a single-layer structure or a double-layer structure.

A gate insulating layer 140 made of an insulating material such as, for example, silicon oxide or silicon nitride is disposed on the gate line 121. For example, the gate insulating layer 140 may be made of, for example, silicon nitride (SiNx), silicon oxide (SiOx), silicon oxynitride (SiOxNy), aluminum oxide (AlOx), yttrium oxide ($Y_2O_3$), hafnium oxide (HfOx), zirconium oxide (ZrOx), aluminum nitride (AlN), aluminum oxynitride (AlNO), titanium oxide (TiOx), barium titanate (BaTiO3), lead titanate ($PbTiO_3$), or a combination thereof.

For example, in an exemplary embodiment, the gate insulating layer 140 may include a first insulating layer 140*a* and a second insulating layer 140*b*. The first insulating layer 140*a* may be made of, for example, silicon nitride ($SiN_x$) with a thickness of about 4000 Å, and the second insulating layer may be made of, for example, silicon oxide ($SiO_2$) with a thickness of about 500 Å. Alternatively, the first insulating layer 140*a* may be made of, for example, silicon oxynitride (SiON), and the second insulating layer 140*b* may be made of, for example, silicon oxide ($SiO_2$). In the present exemplary embodiment, the gate insulating layer 140 is formed as, for example, a double-layer structure but exemplary embodiments of the present invention are not limited thereto. For example, alternatively, the gate insulating layer may be formed as, for example, a single-layer structure.

A plurality of semiconductor layers 151 made of an oxide semiconductor are formed on the gate insulating layer 140. The semiconductor layers 151 mainly extend in, for example, a longitudinal direction and include a plurality of projections 154 extending toward the gate electrodes 124.

The semiconductor layers 151 include, for example, at least one among zinc (Zn), indium (In), tin (Sn), gallium (Ga), and hafnium (Hf). For example, in the present exemplary embodiment, the semiconductor layers 151 may be indium-gallium-zinc oxide.

A plurality of data lines 171, a plurality of source electrodes 173 connected to the data lines 171, and a plurality of drain electrodes 175 are formed on the semiconductor layer 151 and the gate insulating layer 140.

The data lines 171 transmit a data signal and extend mainly in the longitudinal direction, thereby intersecting the gate lines 121. The source electrodes 173 extend, for example, from the data lines 171 thereby overlapping the gate electrodes 124, and may have a "U" shape.

The drain electrodes 175 are separated from the data lines 171 and extend, for example, toward an upper portion of the "U" shape of the source electrodes 173.

Each of the data lines 171, source electrodes 173, and drain electrodes 175 has, for example, a triple-layer structure including barrier layers. For example, the data lines 171 may include a barrier layer 171*p* a main wiring layer 171*q* and a capping layer 171*r*. In addition, the source electrodes 173 may include, for example, a barrier layer 173*p*, a main wiring layer 173*q* and a capping layer 173*r*. Moreover, the drain electrodes 175 may include, for example, a barrier layer 175*p*, a main wiring layer 175*q*, and a capping layer 175*r*. For example, the barrier layers 171*p*, 173*p*, and 175*p* are made of a metal oxide, the main wiring layers 171*q*, 173*q*, and 175*q* are made of copper or a copper alloy, and the capping layers 171*r*, 173*r*, and 175*r* are made of a copper alloy or a metal oxide.

For example, the barrier layers 171*p*, 173*p*, and 175*p* may be made of one of indium-zinc oxide, gallium-zinc oxide, and aluminum-zinc oxide, and the capping layers 171*r*, 173*r*, and 175*r* may be made of one of a copper-manganese alloy, indium-zinc oxide, gallium-zinc oxide, and aluminum-zinc oxide.

Hereafter, the barrier layers 171*p*, 173*p*, and 175*p* and the capping layers 171*r*, 173*r*, and 175*r* according to the present exemplary embodiment will be described.

When the barrier layers 171*p*, 173*p*, and 175*p* are made of gallium-zinc oxide (GZO), the amount of gallium oxide ($Ga_2O_3$) in the entire gallium-zinc oxide (GZO) may be in a range, for example, between about 2.5 mol % to about 10 mol %.

When the barrier layers 171*p*, 173*p*, and 175*p* are made of indium-zinc oxide (IZO), the amount of indium oxide ($In_2O_3$) in the entire indium-zinc oxide (IZO) may be, for example, in a range between about 2.5 wt % (about 0.75 mol % or about 1.5 at %) to about 90 wt % (about 72.5 mol % or about 84.1 at %). When the amount of iridium oxide included in barrier layers 171*p*, 173*p*, and 175*p* is no greater than 2.5 wt %, an under-cut may be seriously generated such that it may be difficult for the barrier layers 171*p*, 173*p* and 175*p* to function as a diffusion preventing layer. Accordingly, 2.5 wt % as a lower limit of the amount of indium oxide is a minimum value to use the barrier layers 171*p*, 173*p* and 175*p* as a diffusion preventing layer between an oxide semiconductor thin film and a thin film including, for example, copper. Also, 90 wt % as an upper limit for the amount of indium oxide included in each of the barrier layers 171*p*, 173*p* and 175*p* may be a maximum value in a range which allows the barrier layers 171*p*, 173*p* and 175*p* to be in a polycrystalline state, although a tailing phenomenon may be generated. If the indium oxide amount is over 90 wt %, patterning of a channel portion may be difficult such that a boundary of the channel portion may be shorted.

Here, when the indium oxide amount is less than about 65 wt %, the barrier layers 171*p*, 173*p*, and 175*p* may be in, for example, a polycrystalline state. When a condition of the polycrystalline state is set up as the upper limit, in an exemplary embodiment of the present invention, the indium oxide amount included in the barrier layers 171*p*, 173*p* and 175*p* may be in a range, for example, from about 2.5 wt % (about 0.75 mol % or about 1.5 at %) to about 65 wt % (about 35.3 mol % or about 52.1 at %).

For example, the indium oxide amount included in the barrier layers 171*p*, 173*p* and 175*p* may be in the range from about 20 wt % (about 6.8 mol % or about 12.8 at %) to about 40 wt % (about 16.4 mol % or about 28.1 at %). The range of amount of indium oxide is described in further detail with reference to FIG. 6.

When the barrier layers 171*p*, 173P and 175*p* are formed of indium-zinc oxide with a thickness of less than about 100 nm, the crystallinity of the barrier layers 171*p*, 173*p* and 175*p* may be confirmed by, for example, a FWHM (full width at half maximum) extraction method using x-ray diffraction (XRD) measurements. For example, in an exemplary embodiment, the barrier layers 171*p*, 173*p* and 175 may have an average crystalline grain size of about 10 Å to about 2000 Å.

When the barrier layers 171*p*, 173*p*, and 175*p* are made of aluminum-zinc oxide (AZO), the amount of aluminum oxide ($Al_2O_3$) in the entire aluminum-zinc oxide (AZO) may be, for example, in the range from about 2.5 mol % to about 50 mol %.

In the present exemplary embodiment, unlike with copper or a copper alloy forming the main wiring layers 171*q*, 173*q*, and 175*q*, by controlling the amount of gallium oxide, indium oxide, or aluminum oxide of the metal oxide included in the barrier layers 171*p*, 173*p*, and 175*p*, the etch rate of the barrier layers 171*p*, 173*p*, and 175*p* may be decreased such that an etch profile of the barrier layers 171*p*, 173*p*, and 175*p* may be increased. For example, by increasing the amount of gallium oxide, indium oxide, or aluminum oxide among the entire metal oxide forming the barrier layers 171*p*, 173*p*, and 175*p*, the etch rate of the barrier layers 171*p*, 173*p*, and 175*p* is decreased such that the under-cut of the barrier layers 171*p*, 173*p*, and 175*p* may be minimized.

When the capping layers 171*r*, 173*r*, and 175*r* are formed of one among indium-zinc oxide, gallium-zinc oxide, and aluminum-zinc oxide, the same range of the barrier layers 171*p*, 173*p*, and 175*p* may be selected such that the characteristic of the thin film transistor may be increased.

When the capping layers 171*r*, 173*r*, and 175*r* are made of indium-zinc oxide (IZO), the amount of indium oxide ($In_2O_3$) in the entire indium-zinc oxide (IZO) may be, for example, in a range between about 2.5 wt % (about 0.75 mol % or about 1.5 at %) to about 90 wt % (about 72.5 mol % or about 84.1 at %). When the amount of indium oxide included in the capping layers 171*r*, 173*r*, and 175*r* is no greater than 2.5 wt %, an under-cut may be seriously generated such that it may be difficult for the capping layers 171*r*, 173*r*, and 175*r* to function as a diffusion preventing layer. Accordingly, 2.5 wt % as a lower limit of the amount of indium oxide is a minimum value to use the barrier layers 171*p*, 173*p* and 175*p* as a diffusion preventing layer between an oxide semiconductor thin film and a thin film including, for example, copper. Also, 90 wt % as an upper limit for the amount of indium oxide included in each of the capping layers 171*r*, 173*r*, and 175*r* may be a maximum value in a range which allows the capping layers 171*r*, 173*r*, and 175*r* to be in a polycrystalline state, although a tailing phenomenon may be generated. If the indium oxide amount is over 90 wt %, patterning of a channel portion may be difficult such that a boundary of the channel portion may be shorted.

Here, when the indium oxide amount is less than about 65 wt %, the capping layers 171*r*, 173*r*, and 175*r* may be in, for example, a polycrystalline state. When a condition of the polycrystalline state is set up as the upper limit, in an exemplary embodiment of the present invention, the indium oxide amount included in the capping layers 171*r*, 173*r*, and 175*r* may be in a range, for example, from about 2.5 wt % (about 0.75 mol % or about 1.5 at %) to about 65 wt % (about 35.3 mol % or about 52.1 at %).

For example, the indium oxide amount included in the barrier layers 171*p*, 173*p* and 175*p* may be in the range from about 20 wt % (about 6.8 mol % or about 12.8 at %) to about 40 wt % (about 16.4 mol % or about 28.1 at %).

The capping layers 171*r*, 173*r*, and 175*r* are formed of the metal oxide instead of a conventional copper manganese material such that a slope (sub-threshold slope; S.S.) value after a threshold voltage is decreased in a voltage-current graph representing the characteristic of the thin film transistor. Accordingly, the characteristic of the thin film transistor may be increased.

Alternatively, in an exemplary embodiment, the capping layers 171*r*, 173*r*, and 175*r* may be omitted such that the data line 171 and the drain electrode 175 may be formed as, for example, a double-layer structure including the barrier layers 171*p*, 173*p*, and 175*p* and the main wiring layers 171*p*, 173*q*, and 175*r*.

The projection 154 of the semiconductor layer 151 includes, for example, an exposed portion that is covered by the data line 171 and the drain electrode 175 between the source electrode 173 and the drain electrode 175. The semiconductor layer 151 may have, for example, substantially the same plane pattern as the data line 171 and the drain electrode 175 except for the exposed portion of the projection 154.

One gate electrode 124, one source electrode 173, and one drain electrode 175 form one thin film transistor (TFT) along with the projection 154 of the semiconductor layer 151. In addition, the channel of the thin film transistor is formed in the projection 154 between the source electrode 173 and the drain electrode 175.

A passivation layer 180 is formed on the data line 171, the drain electrode 175, and the exposed projection 154 of the semiconductor layer 151. The passivation layer 180 may be made of, for example, an inorganic insulator such as silicon nitride or silicon oxide, an organic insulator, and a low dielectric ratio insulator. For example, the passivation layer 180 may be formed of an organic insulator such as polyimide, polyamide, acrylic resin, epoxy resin, cyclo-olefin resin, or BCB (benzocyclobutene).

In the present exemplary embodiment, the passivation layer 180 may include, for example, a lower passivation layer 180*a* and an upper passivation layer 180*b*. For example, the lower passivation layer 180*a* may be formed of silicon oxide, and the upper passivation layer 180*b* may be formed of silicon nitride.

When depositing the passivation layer 180 formed of silicon oxide, the main wiring layers 171*q*, 173*q*, and 175*q* formed with copper directly contact the passivation layer 180 such that lifting is generated by copper oxide (CuOx) generated through contact thereof, or corrosion may be generated when forming a contact hole 185 in the passivation layer 180. The contact hole 185 formed in the passivation layer 180 is discussed in further detail below. However, according to the present exemplary embodiment, the capping layers 171*r*, 173*r*, and 175*r* are positioned under the passivation layer 180 such that the lifting and the corrosion of the data line 171 and the drain electrode 175 may be prevented. In addition, as described above, by controlling the amount of gallium oxide, indium oxide, or aluminum oxide of the metal oxide included in the capping layers 171*r*, 173*r*, and 175*r*, the under-cut of the capping layers 171*r*, 173*r*, and 175*r* may be minimized, thereby increasing the etch profile. Accordingly, the characteristics of the thin film transistor may be increased.

The passivation layer 180 has a plurality of contact holes 185 exposing one end of the drain electrodes 175.

A plurality of pixel electrodes 191 are formed on the passivation layer 180. Each pixel electrode 191 is physically and electrically connected to a drain electrode 175 through a contact hole 185 thereby receiving a data voltage from a drain electrode 175.

The pixel electrode 191 may be made of a transparent conductor such as, for example, indium tin oxide (ITO), indium zinc oxide (IZO), aluminum zinc oxide (AZO), cadmium tin oxide (CTO), or a reflective electric conductor such as, for example, aluminum (Al), gold (Au), silver (Ag), copper (Cu), iron (Fe), titanium (Ti), tantalum (Ta), molybdenum (Mo), rubidium (Rb), tungsten (W), and alloys, or combinations thereof. In addition, the pixel electrode 191 can be formed of, for example, transflective materials or a combination of transparent materials and reflective materials.

Next, the amount of the metal oxide forming the barrier layers 171P, 173P and 175P according to an exemplary embodiment of the present invention will be described.

Figure 3:
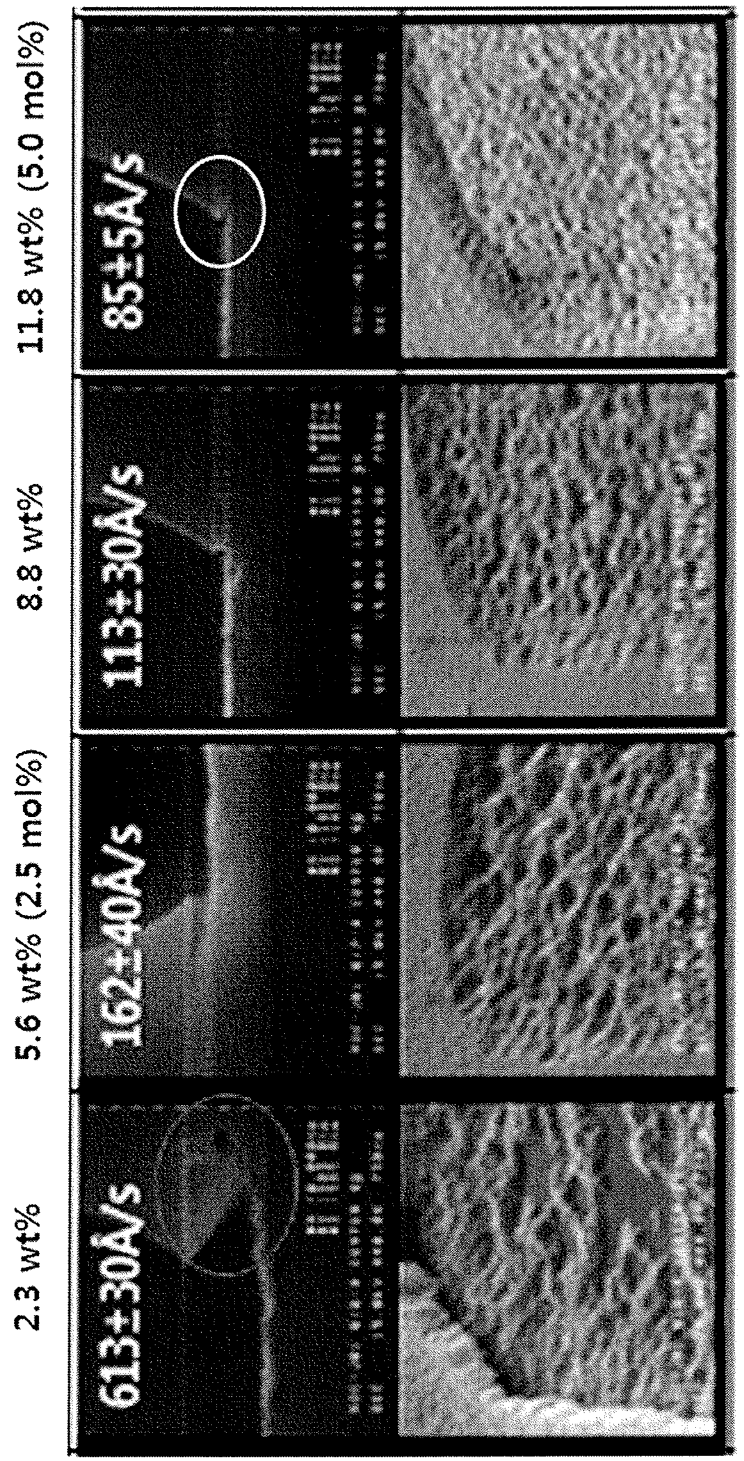
FIG. 3 shows an etch rate and an etch profile according to an amount of gallium oxide ($Ga_2O_3$) in a barrier layer according to an exemplary embodiment of the present invention.

FIG. 3 shows an etch rate and an etch profile according to an amount of gallium oxide ($Ga_2O_3$) in a barrier layer according to an exemplary embodiment of the present invention.

Referring to FIG. 3, the barrier layers 171*p*, 173*p* and 175*p* are formed of, for example, gallium-zinc oxide in accordance with the exemplary embodiment according to FIG. 1 and FIG. 2, and an etch speed and an etch profile of the barrier layers 171*p*, 173*p* and 175*p* are shown while increasing the amount of gallium oxide ($Ga_2O_3$) included in the gallium-zinc oxide.

Firstly, when the amount of gallium oxide is about 2.3 wt %, the etch speed is about 613 Å/s which is a very large etch speed, and the under-cut of the barrier layers 171*p*, 173*p* and 175*p* is serious for the etch profile. As the amount of gallium oxide is gradually increased from about 5.6 wt % (about 2.5 mol %), to about 8.8 wt %, and to about 11.8 wt % (about 5.0 mol %), the etch speed of the barrier layers 171*p*, 173*p* and 175*p* is decreased and the under-cut is reduced.

When the barrier layers 171*p*, 173*p* and 175*p* according to an exemplary embodiment of the present invention are formed of gallium-zinc oxide, the amount of gallium oxide included in each of the barrier layers 171*p*, 173*p* and 175*p* may be in the range from, for example, about 2.5 mol % (about 5.6 wt %) to about 10 mol %. When the amount of gallium oxide is less than about 2.5 mol % (about 5.6 wt %), the under-cut is seriously generated. Moreover, when the amount gallium oxide is larger than about 10 mol %, the tailing of the barrier layers 171*p*, 173*p* and 175*p* is seriously generated such that the channel may be shorted.

Figure 4:
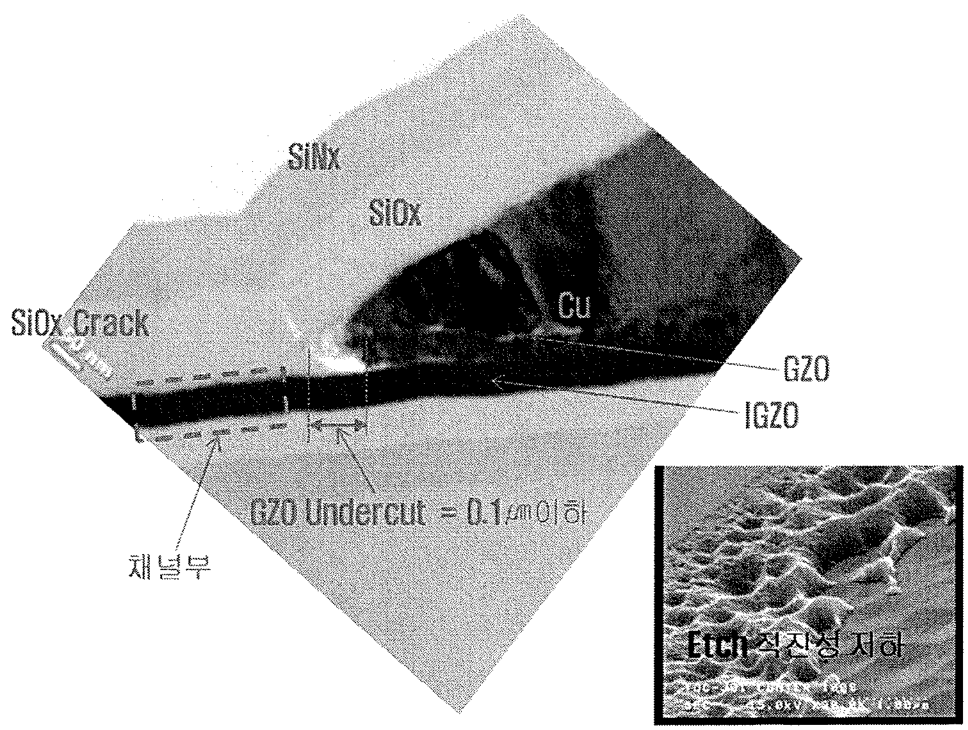
FIG. 4 is a photo showing an under-cut of a barrier layer in a comparative example of the present invention.
Figure 5:
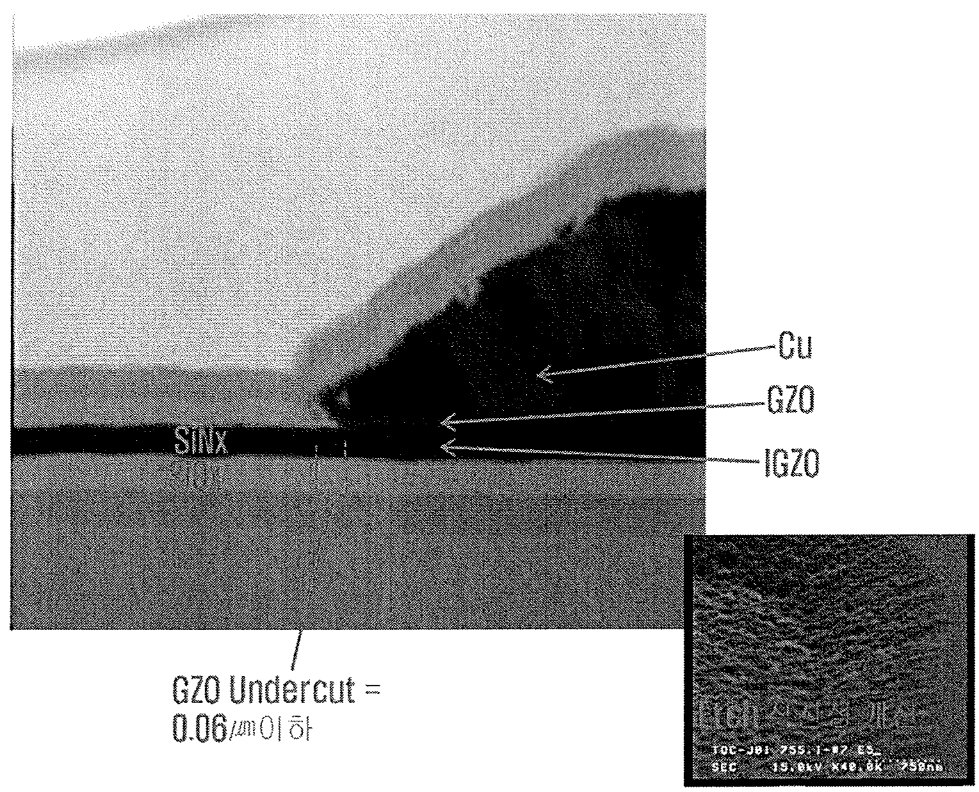
FIG. 5 is a photo showing an under-cut of a barrier layer according to an exemplary embodiment of the present invention.

FIG. 4 is a photo showing an under-cut of a barrier layer in a comparative example of the present invention. FIG. 5 is a photo showing an under-cut of a barrier layer according to an exemplary embodiment of the present invention.

Referring to FIG. 4 and FIG. 5, it is noted that when the amount of gallium oxide ($Ga_2O_3$) included in each of the barrier layers 171*p*, 173*p* and 175*p* made of gallium-zinc oxide is about 5.6 wt % (2.5 mol %), the under-cut of the barrier layers 171*p*, 173*p* and 175*p* is generated at about 0.1 um. Also, when the amount of gallium oxide ($Ga_2O_3$) included in each of the barrier layers 171*p*, 173*p* and 175*p* is about 11.8 wt % (about 5.0 mol %), the under-cut of the barrier layers 171*p*, 173*p* and 175*p* is generated at about 0.06 um. Accordingly, compared with the comparative example, in an exemplary embodiment of the present invention, the under-cut of the barrier layers 171*p*, 173*p* and 175*p* is reduced by about 40% and the etch profile of the barrier layers 171*p*, 173*p* and 175*p* is increased.

Figure 6:
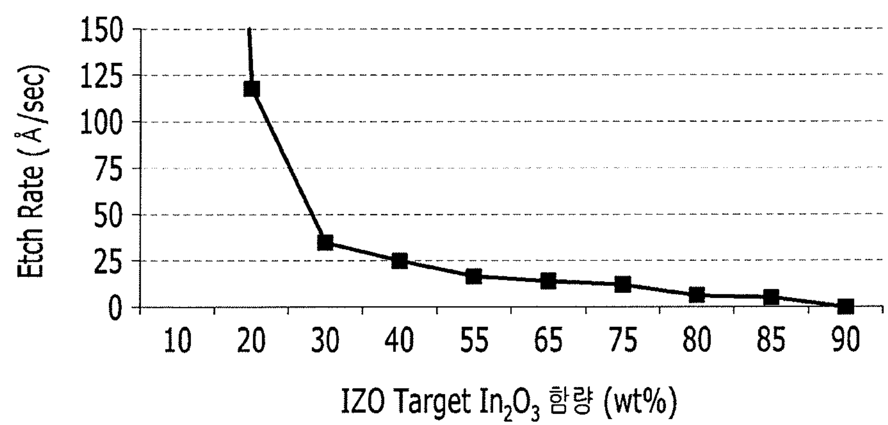
FIG. 6 is a graph showing an etch rate according to an amount of indium oxide ($In_2O_3$) in a barrier layer according to an exemplary embodiment of the present invention.

FIG. 6 is a graph showing an etch rate according to an amount of indium oxide ($In_2O_3$) in a barrier layer according to an exemplary embodiment of the present invention.

Referring to FIG. 6, the barrier layers 171*p*, 173*p* and 175*p* are formed of, for example, indium-zinc oxide in accordance with the exemplary embodiment according to FIG. 1 and FIG. 2, and the etch speed of the barrier layers 171*p*, 173*p* and 175*p* is shown while the amount of indium oxide ($In_2O_3$) included in indium-zinc oxide is gradually increased.

As the amount of indium oxide ($In_2O_3$) included in the barrier layers 171*p*, 173*p* and 175*p* is increased, the etch speed (etch rate) of the barrier layers 171*p*, 173*p* and 175*p* is gradually decreased. If the etch speed is larger than about 110 Å/s, the under-cut of the barrier layers 171*p*, 173*p* and 175*p* may be generated, and if the etch speed is less than about 25 Å/s, the tailing may be generated.

The amount of the indium oxide corresponding to the etch speed of about 110 Å/s is about 20 wt %. However, when considering an error that may be generated according to a change in the etching conditions, the lower limit of the indium oxide amount may be set as, for example, about 15 wt %, and the upper limit of the indium oxide amount may be set as, for example, about 65 wt %. The upper limit of about 65 wt % for the amount of indium oxide represents the maximum amount of indium oxide which may be included in the barrier layers 171*p*, 173*p* and 175*p* and still have the barrier layers 171*p*, 173*p* and 175*p* in a polycrystalline state. Accordingly, when the barrier layers 171*p*, 173*p* and 175*p* according to an exemplary embodiment of the present invention are formed of indium-zinc oxide, the amount of indium oxide included in the barrier layers 171*p*, 173*p* and 175*p* may be in the range, for example, from about 15 wt % (about 4.9 mol % or about 9.4 at %) to about 65 wt % (about 35.3 mol % or about 52.1 at %). For example, in an exemplary embodiment of the present invention, the indium oxide may be included in the barrier layers 171*p*, 173*p* and 175*p* in a range between about 20 wt % (about 6.8 mol % or about 12.8 at %) and about 40 wt % (about 16.4 mol % or about 28.1 at %) corresponding to the boundary of the above-described etch speed.

Figure 7:
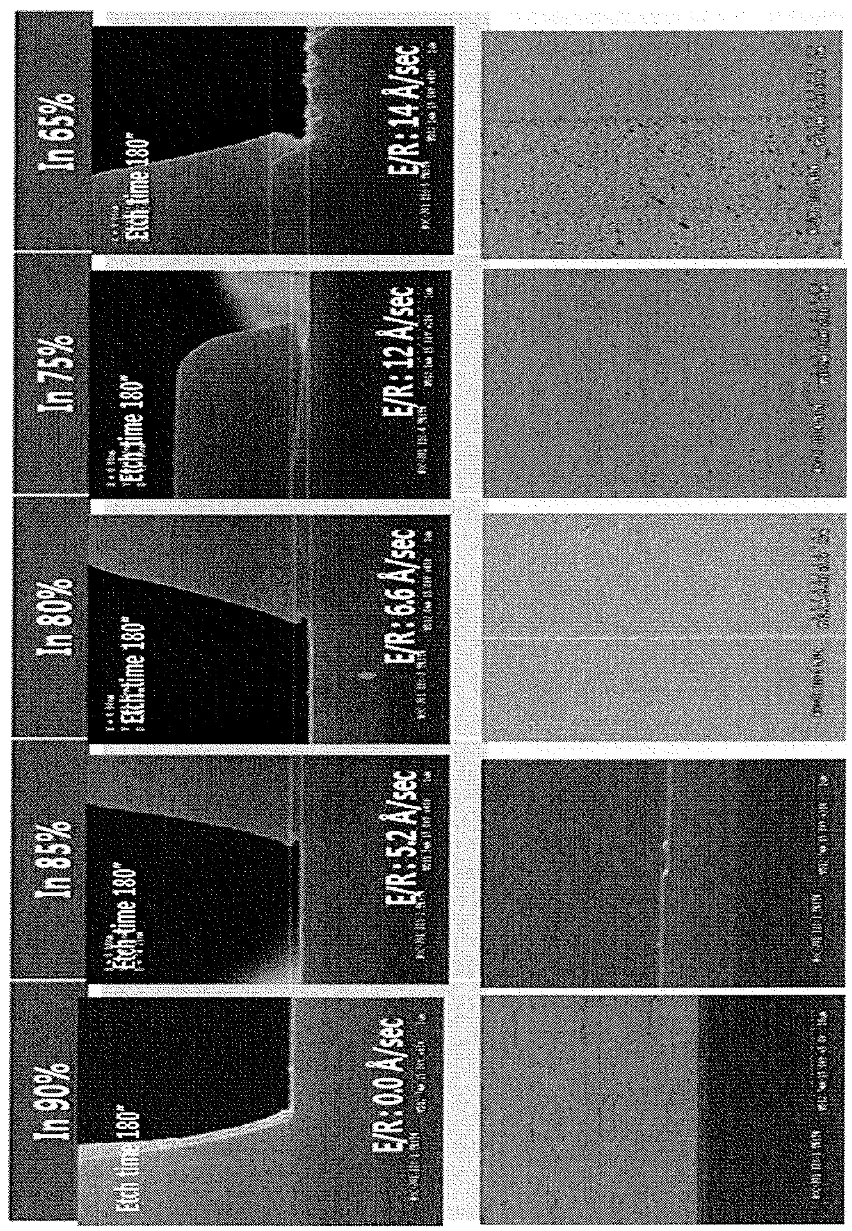
FIG. 7 and FIG. 8 show an etch rate and an etch profile according to an amount of indium oxide ($In_2O_3$) in a barrier layer according to an exemplary embodiment of the present invention.
Figure 8:
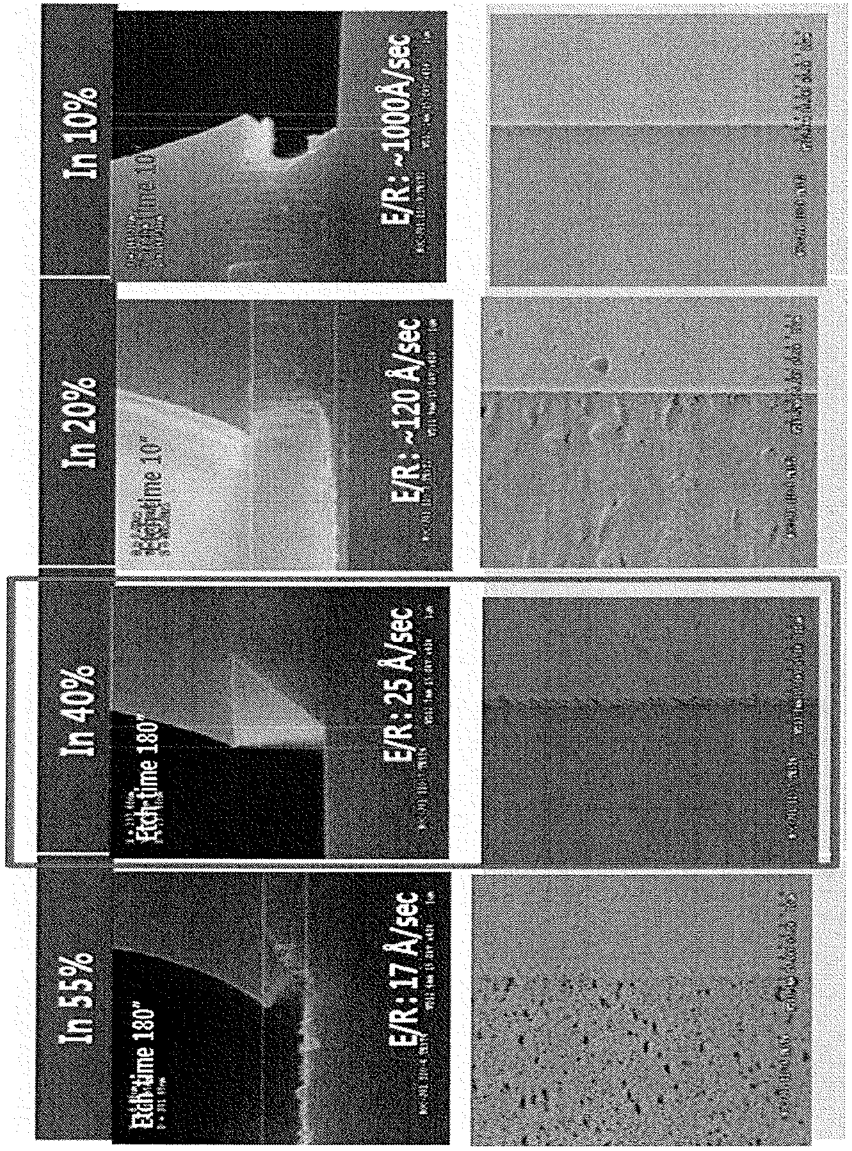

FIG. 7 and FIG. 8 show an etch rate and an etch profile according to an amount of indium oxide ($In_2O_3$) in a barrier layer according to an exemplary embodiment of the present invention.

Referring to FIG. 7 and FIG. 8, when the amount of indium oxide ($In_2O_3$) is about 10 wt %, the under-cut of the barrier layers 171*p*, 173*p* and 175*p* is serious. In addition, as the amount of indium oxide ($In_2O_3$) is increased, the under-cut of the barrier layers 171*p*, 173*p* and 175*p* may be decreased. However, if the amount of indium oxide ($In_2O_3$) is very large such that the etch rate is decreased, the tailing may appear.

As described above, if the under-cut of the barrier layers 171*p*, 173*p* and 175*p* disposed under the main wiring layers 171*q*, 173*q* and 175*q* formed of the copper or copper alloy is generated, a void is largely generated according to oxidation of the main wiring layers 171*q*, 173*q* and 175*q* such that the channel portion may be deteriorated. For example, an edge portion of the source electrode 173 and the drain electrode 175 formed with the material including copper is oxidized by the layer of silicon oxide contacted thereto such that the channel characteristic of the thin film transistor may be deteriorated. However, this difficulty may be prevented by forming the barrier layers 171*p*, 173*p* and 175*p* of a metal oxide such as indium-zinc oxide (IZO), gallium-zinc oxide (GZO), or aluminum-zinc oxide (AZO).

When the capping layers 171*r*, 173*r* and 175*r*, are formed using conventional copper manganese material, the capping layers 171*r*, 173*r* and 175*r* are oxidized by the passivation layer 180 formed of silicon oxide adjacent thereto such that the characteristics of the thin film transistor may be affected. However, this difficulty may be prevented by forming the capping layers 171*r*, 173*r* and 175*r* of a metal oxide such as indium-zinc oxide (IZO), gallium-zinc oxide (GZO), or aluminum-zinc oxide (AZO). Also, by controlling the amount of the oxide included in the capping layers 171*r*, 173*r* and 175*r*, the etch profile may be increased.

The barrier layers 171*p*, 173*p* and 175*p* may function as an ohmic contact while preventing the copper diffusion. Accordingly, the barrier layers 171*p*, 173*p* and 175*p* should not be formed of the oxide semiconductor like the semiconductor layer 151 forming the channel.

A thin film transistor array panel having the semiconductor layer 151 made of the oxide semiconductor including indium, zinc, or tin was described. Next, referring to FIG. 9, a liquid crystal display including the thin film transistor array panel 100 according to the present exemplary embodiment will be described.

Figure 9:
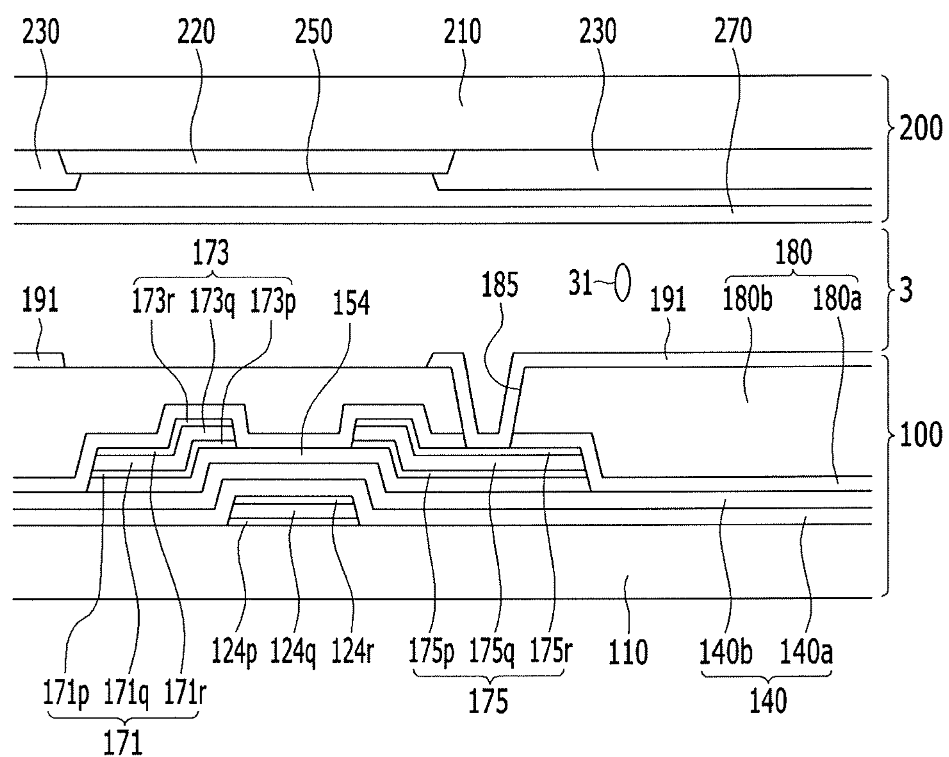
FIG. 9 is a cross-sectional view of a liquid crystal display according to an exemplary embodiment of the present invention.

FIG. 9 is a cross-sectional view of a liquid crystal display according to an exemplary embodiment of the present invention.

Referring to FIG. 9, a second substrate 210 facing the first substrate 110 is disposed. The second substrate 210 may be an insulation substrate made of, for example, transparent glass, quartz or plastic. Also, in an exemplary embodiment, the second substrate 210, may be formed of, for example, ceramic or silicon materials. Further, in an exemplary embodiment, the second substrate 210 may be, for example, a flexible substrate. Suitable materials for the flexible substrate may include, for example, polyethersulfone (PES), polyethylenenaphthalate (PEN), polyethylene (PE), polyimide (PI), or polyvinyl chloride.

A light blocking member 220 is formed on the second substrate 210. The light blocking member 220 is referred to as a black matrix and prevents light leakage. The light blocking member 220 may be formed of a light-shielding metal material such as, for example, chrome (Cr), or an acrylic resin formed by mixing carbon with a metal oxide material. Alternatively, in an exemplary embodiment, the blocking member 220 may be omitted.

A plurality of color filters 230 are formed on the second substrate 210 and the light blocking member 220. Most of the color filters 230 are disposed in the regions enclosed by the light blocking members 220, and may be extended according to the column direction of the pixel electrodes 191. Each color filter 230 may display, for example, one among three primary colors such as the primary colors red, green, and blue. However, exemplary embodiments of the present invention are not limited to the three primary colors such as red, green, and blue. For example, alternatively, the color filter 230 may display, for example, one of cyan, magenta, yellow, and white-based colors.

The light blocking member 220 and the color filter 230 are formed, for example, on an opposed display panel 200. Alternatively, for example, at least one of the light blocking member 220 and the color filter 230 may be formed on the thin film transistor array panel 100.

An overcoat 250 is formed on the color filter 230 and the light blocking member 220. The overcoat 250 may be made of, for example, an (organic) insulator, and prevents the color filter 230 from being exposed and provides a flat surface. For example, in an exemplary embodiment, the overcoat 250 may be formed of an (organic) insulator such as benzocyclobutene (BCB) or acrylic resin. Alternatively, for example, in an exemplary embodiment, the overcoat 250 may be omitted.

A common electrode 270 is formed on the overcoat 250. The common electrode 270 may be made of, for example, a transparent conductive material such as ITO (indium tin oxide), IZO (indium zinc oxide), aluminum zinc oxide (AZO), or cadmium tin oxide (CTO).

The pixel electrode 191 applied with the data voltage forms an electric field along with the common electrode 270 applied with the common voltage such that liquid crystal molecules 31 of the liquid crystal layer 3 between the pixel electrode 191 and the common electrode 270 are rearranged. The pixel electrode 191 and the common electrode 270 form a capacitor to maintain an applied voltage even after a thin film transistor is turned off.

The pixel electrode 191 overlaps a storage electrode line (not shown) to form a storage capacitor, thereby increasing the voltage storage capacity of a liquid crystal capacitor.

In addition, for example, in exemplary embodiments, an alignment layer (not shown) may be formed on at least one of the thin film transistor array panel 100 and the opposed display panel 200 for aligning liquid crystal molecules 31 in the liquid crystal layer 3 in a desired direction.

A thin film transistor array panel according to the present exemplary embodiment is discussed above as being applied to a liquid crystal display, but the present exemplary embodiment may also be widely applied to, for example, display devices performing a switching operation using an organic light emitting diode display and other thin film transistors.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. A thin film transistor array panel comprising:

a gate line disposed on a substrate and including a gate electrode;

a semiconductor layer including an oxide semiconductor disposed on the substrate; and a data wire layer disposed on the substrate and including a data line intersecting the gate line, a source electrode connected to the data line, and one end of a drain electrode facing the source electrode, wherein at least one of the data line, the source electrode or the drain electrode of the data wire layer includes a barrier layer, a main wiring layer disposed on the barrier layer, and a capping layer disposed on the main wiring layer, wherein the main wiring layer includes at least one of copper and a copper alloy, wherein the barrier layer and the capping layer include a metal oxide, wherein the barrier layer is in a polycrystalline state, and wherein the metal oxide includes zinc.

2. The thin film transistor array panel of claim 1, wherein the barrier layer includes indium-zinc oxide (IZO), gallium-zinc oxide (GZO) , or aluminum-zinc oxide (AZO).

3. The thin film transistor array panel of claim 2, wherein the barrier layer includes gallium-zinc oxide (GZO), and wherein an amount of gallium oxide ($Ga_2O_3$) included in gallium-zinc oxide (GZO) is in a range from about 2.5 mol % to about 10 mol %,

4. The thin film transistor array panel of claim 2, wherein the barrier layer includes indium-zinc oxide (IZO), and wherein an amount of indium oxide ($In_2O_3$) included in indium-zinc oxide (IZO) is in a range from about 2.5 wt % to about 90 wt %.

5. The thin film transistor array panel of claim 4, wherein the barrier layer includes indium-zinc oxide (IZO), and wherein the amount of indium oxide ($In_2O_3$) included in indium-zinc oxide (IZO) is no greater than about 65 wt %.

6. The thin film transistor array panel of claim 5, wherein the barrier layer includes indium-zinc oxide (IZO), and wherein the amount of indium oxide ($In_2O_3$) included in indium-zinc oxide (IZO) is in a range from about 15 wt % to about 65wt %.

7. The thin film transistor array panel of claim 6, wherein the barrier layer includes indium-zinc oxide (IZO), and wherein the amount of indium oxide ($In_2O_3$) included in indium-zinc oxide (IZO) is in a range from about 20 wt % to about 40 wt %

8. The thin. film transistor array panel of claim 2, wherein the barrier layer includes indium-zinc oxide (IZO), wherein a thickness of the barrier layer including indium-zinc oxide is no greater than about 100 nm, and wherein the barrier layer has an average crystalline grain size of about 10 Å to about 2000 Å.

9. The thin film transistor array panel of claim 2, wherein the barrier layer includes aluminum-zinc oxide (ASC) and wherein an amount of aluminum oxide ($Al_2O_3$) included in aluminum-zinc oxide (AZO) is in a range from about 2.5 mol % to about 50 mol %.

10. The thin film transistor array panel of claim 1, wherein the capping layer includes indium-zinc oxide (IZO), gallium-zinc oxide (GZO), or aluminum-zinc oxide (AZO).

11. The thin film transistor array panel of claim 10, wherein the capping layer includes gallium-zinc oxide (GZO) and wherein an amount of gallium oxide ($Ga_2O_3$) included in gallium-zinc oxide (GZO) is in a range from about 2.5 mol % to about 10 mol %.

12. The thin film transistor array panel of claim 11, wherein the capping layer includes indium-zinc oxide (IZO) and wherein an amount of indium oxide ($In_2O_3$) included in indium-zinc oxide (IZO) is in a range from about 20 wt % to about 40 wt %.

13. The thin film transistor array panel of claim 10, wherein the capping layer includes aluminum-zinc oxide (AZO) and wherein an amount of aluminum oxide ($Al_2O_3$) included in aluminum-zinc oxide (AZO) is in a range from about 2.5 mol % to about 50 mol %.

14. The thin film transistor array panel of claim 1, wherein the barrier layer has conductivity.

15. The thin film transistor array panel of claim 1, wherein the semiconductor layer has a same planar shape as the source electrode, the drain electrode, and the data line except for a channel portion of the semiconductor layer.

16. The thin film transistor array panel of claim I, wherein the barrier layer and the main wiring layer directly contact with each other.

17. The thin film transistor array panel of claim 1, wherein the barrier layer is disposed between the main wiring layer and the semiconductor layer.

18. The thin film transistor array panel of claim 1, wherein an etch rate of the barrier layer is in a range from about 25 Å/s to about 110 Å/s.

* * * * *